(12) United States Patent
Horsley et al.

(10) Patent No.: US 10,324,181 B2
(45) Date of Patent: Jun. 18, 2019

(54) MINIATURE MICROMACHINED ULTRASONIC RANGEFINDER

(71) Applicants: David Horsley, Albany, CA (US);
Andre Guedes, Lisbon (PT);
Meng-Hsiung Kiang, Albany, CA (US);
Richard J. Przybyla, Emeryville, CA (US); Stefon Shelton, Oakland, CA (US)

(72) Inventors: David Horsley, Albany, CA (US);
Andre Guedes, Lisbon (PT);
Meng-Hsiung Kiang, Albany, CA (US);
Richard J. Przybyla, Emeryville, CA (US); Stefon Shelton, Oakland, CA (US)

(73) Assignee: CHIRP MICROSYSTEMS, INC., Berkeley, CA (US)

( * ) Notice: Subject to any disclaimer, the term of this patent is extended or adjusted under 35 U.S.C. 154(b) by 75 days.

(21) Appl. No.: 15/415,570

(22) Filed: Jan. 25, 2017

(65) Prior Publication Data

US 2017/0184718 A1 Jun. 29, 2017
US 2017/0329005 A9 Nov. 16, 2017

Related U.S. Application Data

(63) Continuation of application No. PCT/US2015/043256, filed on Jul. 31, 2015.
(Continued)

(51) Int. Cl.
*G01S 15/10* (2006.01)
*G01S 7/524* (2006.01)
(Continued)

(52) U.S. Cl.
CPC .......... *G01S 15/10* (2013.01); *B06B 1/0215* (2013.01); *B06B 1/0292* (2013.01);
(Continued)

(58) Field of Classification Search
CPC .......... G01S 15/10; G01S 7/521; G01S 15/87; G01S 15/46; G01S 15/04; G01S 7/524;
(Continued)

(56) References Cited

U.S. PATENT DOCUMENTS 7,281,082 B1 10/2007 Knapp
9,239,386 B2 1/2016 Elian et al.
(Continued)

FOREIGN PATENT DOCUMENTS

CN 107431122 A * 12/2017 .......... B06B 1/0215
DE 2335613 B2 1/1976
(Continued)

OTHER PUBLICATIONS

Pryzbyla et al "An Ultrasonic Rangefinder Based on an AIN Piezoelectric Micromachined Ultrasound Transducer" Sensors, 2010 IEEE. IEEE, 2010.
(Continued)

*Primary Examiner* — Daniel Pihulic
(74) *Attorney, Agent, or Firm* — JDI Patent; Joshua D. Isenberg; Robert Pullman

(57) ABSTRACT

A miniature rangefinder includes a housing, a micromachined ultrasonic transducer, and signal processing circuitry. The housing includes a substrate and a lid. The housing has one or more apertures and the micromachined ultrasonic transducer is mounted over an aperture. The micromachined ultrasonic transducer may function as both a transmitter and a receiver. An integrated circuit is configured to drive the transducer to transmit an acoustic signal, detect a return
(Continued)

signal, and determine a time of flight between emitting the acoustic signal and detecting the return signal.

23 Claims, 9 Drawing Sheets

Related U.S. Application Data

(60) Provisional application No. 62/032,041, filed on Aug. 1, 2014.

(51) Int. Cl.
| | |
|---|---|
| *B81B 3/00* | (2006.01) |
| *B06B 1/02* | (2006.01) |
| *B06B 1/06* | (2006.01) |
| *G01S 7/521* | (2006.01) |
| *G01S 7/527* | (2006.01) |
| *G01S 15/04* | (2006.01) |
| *G01S 15/46* | (2006.01) |
| *G01S 15/87* | (2006.01) |

(52) U.S. Cl.
CPC .......... *B06B 1/0644* (2013.01); *B06B 1/0651* (2013.01); *B81B 3/0021* (2013.01); *G01S 7/521* (2013.01); *G01S 7/524* (2013.01); *G01S 7/527* (2013.01); *G01S 15/04* (2013.01); *G01S 15/46* (2013.01); *G01S 15/87* (2013.01); *B06B 2201/51* (2013.01); *B06B 2201/55* (2013.01); *B06B 2201/70* (2013.01); *G01S 2015/465* (2013.01)

(58) Field of Classification Search
CPC . G01S 7/527; G01S 2015/465; B81B 3/0021; B06B 1/0292; B06B 1/0644; B06B 1/0215; B06B 1/0651; B06B 2201/70; B06B 2201/55; B06B 2201/51
See application file for complete search history.

(56) References Cited

U.S. PATENT DOCUMENTS

| | | |
|---|---|---|
| 2006/0202885 A1 | 9/2006 | Chen |
| 2010/0309225 A1 | 12/2010 | Gray et al. |
| 2012/0242400 A1 | 9/2012 | Shaeffer et al. |
| 2013/0088941 A1 | 4/2013 | Elian et al. |
| 2017/0184718 A1 * | 6/2017 | Horsley ................ B06B 1/0215 |
| 2017/0329005 A9 * | 11/2017 | Horsley ................ B06B 1/0215 |

FOREIGN PATENT DOCUMENTS

| | | | |
|---|---|---|---|
| DE | 102012222334 A1 | 6/2014 | |
| EP | 3175490 A1 * | 6/2017 | ........... B06B 1/0215 |
| EP | 3175490 A4 * | 8/2018 | ........... B06B 1/0215 |
| GB | 2508734 A | 6/2014 | |
| WO | WO-2016019317 A1 * | 2/2016 | ........... B06B 1/0215 |

OTHER PUBLICATIONS

Shin et al "Acoustic Doppler velocity measurement system using capacitive micro-machined ultrasound transducer array technology" The Journal of the Acoustical Society of America 134.2 (2013): 1011-1020.
U.S. Appl. No. 62/032,041, filed Jul. 30, 2014.
Extended European Search Report dated Jul. 16, 2018 for European Patent Application No. 15827176.7.
International Search Report and Written Opinion for International Application No. PCT/US15/43256, dated Nov. 6, 2015.
Minchui Shin et al: "Acoustic Doppler 2 velocity measurement system using capacitive micromachined ultrasound transducer array technology", the Journal of the Acoustical Society of America, vol. 134, No. 2, Aug. 1, 2013 (Aug. 1, 2013), pp. 1011-1020, XP055390916, New York, NY, US ISSN: 0001-4966, DOI: 10.1121/1.4812249.
Minchul Shin et al: "Acoustic Doppler velocity measurement system using capacitive micromachined ultrasound transducer array technology", The Journal of the Acoustical Society of America, vol. 134, No. 2, Aug. 1, 2013 (Aug. 1, 2013), pp. 1011-1020, XP055390916, New York, NY, US.
Partial European Search Report dated Mar. 2, 2018 for European Patent Application No. 15827176.7.
R. Przybyla et al. "An Ultrasonic Rangefinder Based on an AIN Piezoelectric Micromachined Ultrasound Transducer", Sensors, 2010 IEEE, IEEE, Piscataway, NJ, USA, Nov. 1, 2010 (Nov. 1, 2010), pp. 2417-2421, XP031978178, DOI: 10.1109/ICSENS.2010.5690777ISBN: 978-1-4244-8170-5.
Richard Przybyla et al: "An ultrasonic rangefinder based on an AIN piezoelectric micromachined ultrasound transducer", Sensors, 2010 IEEE, IEEE, Piscataway, NJ, USA, Nov. 1, 2010 (Nov. 1, 2010), pp. 2417-2421.
Office Action dated Mar. 15, 2019 for Chinese patent application No. 2015800469430.

* cited by examiner

MINIATURE MICROMACHINED ULTRASONIC RANGEFINDER

CLAIM OF PRIORITY

This application is a continuation of International Patent Application Number PCT/US2015/043256 filed Jul. 31, 2015, the entire disclosures of which are incorporated herein by reference. International Patent Application Number PCT/US2015/043256 claims the priority benefit of U.S. Provisional Patent Application No. 62/032,041, filed Aug. 1, 2014, the entire disclosures of which are incorporated by reference.

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND OF THE INVENTION

Proximity sensors are used in a variety of consumer electronic devices, including in cell phones. In cell phones, the proximity sensor is used to detect when the user places the phone near their ear so that the touch screen can be disabled. Existing sensors for this application are optical proximity sensors, based on an infrared (IR) light emitting diode (LED) and one or more photodetectors. A typical proximity sensor (such as the Avago APDS-9950, Taos TMD2771, Capella Microsystems CM36683P) functions by detecting the intensity of IR light reflected from an object. The proximity sensor indicates when an object is near the sensor, typically within 100 mm+/−20 mm of the sensor, when the reflected IR level crosses a pre-determined threshold.

These proximity sensors suffer from a number of limitations. The first is that reflected IR intensity is a poor measure of proximity: the IR light reflected from two objects at the same distance will depend on the size and color of the object. This problem is very evident to cell phone users with dark hair and/or skin, who often find that their cell phone display and touch screen do not properly disable when they use the phone. A second problem is the high power required by the LED source, which can consume more than 10 milliwatts (mW). The stand-by power consumption of a typical cell phone is approximately 50 mW so the proximity sensor must be turned off most of the time to avoid draining the battery. A third problem is that optical proximity sensors can detect objects only over a limited range (approximately 100 mm). For applications in tablets, notebook computers, and monitors, it is desirable to be able to detect objects over a longer range (up to 600 mm or more). Finally, many applications require an accurate measure of distance (e.g. to the user's hand or head) that current optical proximity sensors simply cannot provide.

Accordingly, what is needed is a proximity sensor that provides an accurate measurement of the distance to an object, independent of the color or size of the object, that is low power (ideally below 1 mW), and that can operate at both short ranges (1 cm) and long range (>10 cm).

BRIEF SUMMARY OF THE DISCLOSURE

Aspects of the present disclosure generally relate to ultrasonic rangefinders and proximity sensors. In various implementations, an ultrasonic rangefinder may include a housing containing a micromachined ultrasonic transducer and an application specific integrated circuit (ASIC). In various implementations, the rangefinder may have a digital serial interface and an interrupt pin that is used to signal when an object is detected within a predetermined range of the rangefinder. The serial interface allows the end user to program the predetermined range, to read out the range of a detected object, and configure various aspects of the rangefinder. The rangefinder may be used in proximity sensing applications such as in consumer electronics. Multiple rangefinders may be used together to allow triangulation of object location in three-dimensional space.

BRIEF DESCRIPTION OF THE SEVERAL VIEWS OF THE DRAWING(S)

The invention will be more fully understood by reference to the following drawings which are for illustrative purposes only:

FIGS. 1A-B illustrates the operation of the ultrasonic rangefinder, according to various aspects of the present disclosure.

DETAILED DESCRIPTION OF THE INVENTION

Although the description herein contains many details, these should not be construed as limiting the scope of the claimed invention but as merely providing illustrations of some of the aspects of the present disclosure. Therefore, it will be appreciated that the scope of the present invention fully encompasses other implementations which may appreciated by those skilled in the art.

According to an aspect of the present disclosure an ultrasonic rangefinder may include a micromachined ultrasonic transducer (MUT) and an application specific integrated circuit (ASIC) packaged together in a small housing similar to that of a micro-electromechanical systems (MEMS) microphone. It will be appreciated that the following embodiments are provided by way of example only, and that numerous variations and modifications are possible. For example, while an implementation is shown having an acoustic port in the bottom of the housing, the acoustic port may have other locations, such as in the top of the housing. All such variations that would be apparent to one of ordinary skill in the art are intended to fall within the scope of this disclosure. It will also be appreciated that the drawings are not necessarily to scale, with emphasis being instead on the distinguishing features of the rangefinder device disclosed herein.

Benefits of the present subject matter include, but are not limited to: 1) a rangefinder that can measure the range to an object using ultrasonic time-of-flight rather than simple reflected intensity and therefore provides a much more accurate measurement than existing optical proximity sensors; 2) the ultrasonic time-of-flight measurement is not sensitive to the color of an object, unlike existing optical proximity sensors, therefore it provides a more consistent measurement of range and proximity across a wide range of objects; 3) an ultrasound transducer consumes far less power than a light source of the type used in an optical proximity sensor; 4) the integrated circuit electronics provide a simple digital interface making the sensor much easier to use than existing ultrasonic sensors; 5) the integrated circuit electronics may incorporate a charge-pump so that the rangefinder requires only a low-voltage power supply input; 6) the ultrasonic rangefinder may serve as both a transmitter and a receiver of ultrasound, eliminating the need for separate transmitter and receiver devices; 7) the ultrasonic rangefinder has a lower manufacturing cost than other ultrasonic sensors.

Figure 1A:
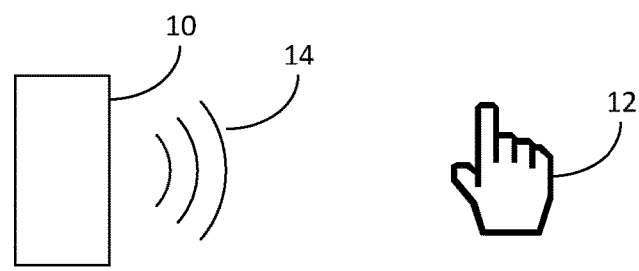
Figure 1B:
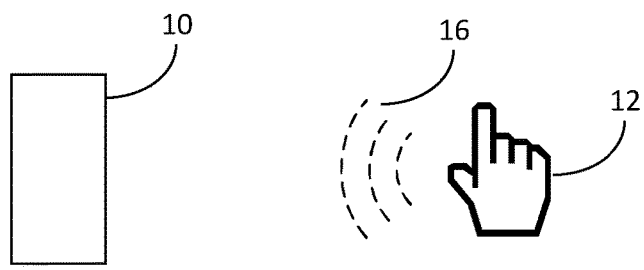

FIGS. 1A-B illustrate the operation of an ultrasonic rangefinder 10 according to various aspects of the present disclosure. The rangefinder 10 transmits a pulse of ultrasound 14. An object 12 approaching the rangefinder 10 is detected based on a reflected echo 16 when the original ultrasound pulse 14 is reflected from object 12. The time-of-flight (ToF), which is the time elapsed from transmitting the original pulse 14 to receiving the reflected echo 16, is used to detect the range of object 12 from the rangefinder 10. Using the known value of the speed of sound, c, the range is computed as range=ToF*c/2. While FIGS. 1A-B show a single object 12, multiple objects having different ranges from the rangefinder 10 may also be detected.

Figure 2:
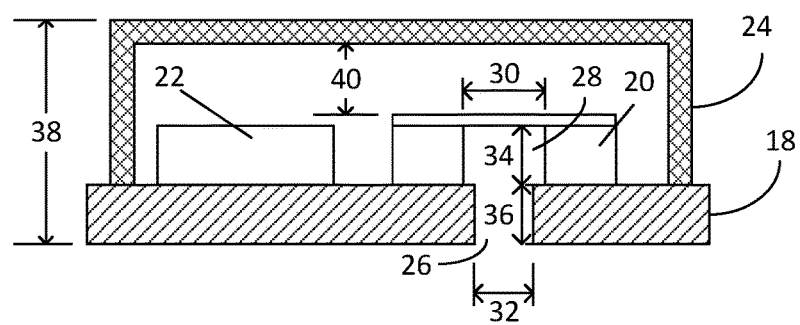
FIG. 2 is a cross section view of a rangefinder according to an aspect of the present disclosure.

FIG. 2 illustrates a cross-section view of an embodiment of the ultrasonic rangefinder. The rangefinder includes a substrate 18, a micromachined ultrasonic transducer (MUT) 20, an application specific integrated circuit 22 and a lid 24. The substrate 18 may be composed of a laminate material similar to that commonly used in the packaging of MEMS microphones. Many materials may be used for lid 24, including laminate, plastic or metal. By way of example, and not by way of limitation, the integrated circuit (IC) 22 may be an application specific integrated circuit (ASIC). As is generally understood by those skilled in the art, the term ASIC generally refers to an IC customized for a particular use, rather than intended for general-purpose use. An ASIC is sometimes referred to as a system-on-chip (SoC). Examples of ASIC designs include standard cell, gate array, such as field programmable gate array (FPGA), full custom, and structured.

An acoustic aperture or port 26 may be located beneath MUT 20 so that port 26 is aligned beneath a cavity or pipe 28 formed in MUT 20. The diameter 30 and length 34 of pipe 28 and the diameter 32 and length 26 of port 26 may be dimensioned such that port 26 and pipe 28 form an acoustic resonator in order to enhance the acoustic performance of the MUT. For a given operating frequency f, the resonance condition occurs when the effective length of the acoustic resonator $L_e$ is equal to an odd multiple of one-quarter wavelength, $L_e=n*\lambda/4$, where n=1, 3, 5, . . . is an odd integer and $\lambda=c/f$ is the acoustic wavelength of sound with speed c and frequency f. The effective length $L_e$ is the sum of pipe length 34 and port length 36 plus a correction factor $\alpha$ determined by pipe diameter 30 and port diameter 32. For a circular port with approximately equal pipe diameter 30 and port diameter 32, the correction factor is approximately equal to $\alpha=0.35*D$, where D is the diameter of both port 26 and pipe 28. For other geometries, the correction factor $\alpha$ may range from 0.25 to 0.7. In some embodiments, the acoustic resonator may include an acoustic tube within a product into which the rangefinder 10 is incorporated. By way of example, and not by way of limitation, a cylindrical hole may be drilled through the cover glass or housing of the product. In this case, the length of the acoustic resonator is the sum of port 26 in substrate 18, pipe 28 in MUT 20 and the length of the acoustic tube in the cover glass or housing.

The height 38 of the rangefinder is typically from 0.4 mm to 3 mm, and specifically may range from 0.5 mm to 1.5 mm and more specifically from 0.7 mm to 1.3 mm. Considering the internal dimensions, the gap 40 between the top of MUT 20 and the lid 24 is chosen so that it sound reflecting from lid 24 does not degrade the acoustic performance of the rangefinder. As an illustration, for a MUT operating at 200 kHz, the acoustic wavelength is $\lambda=1.7$ mm and gap 40 is chosen to be less than $\lambda/4=0.43$ mm. Alternatively, the gap 40 may be chosen to maximize the bandwidth of MUT 20 by setting the gap 40 to increase the damping incurred due to the sound reflecting from lid 24.

Figure 3:
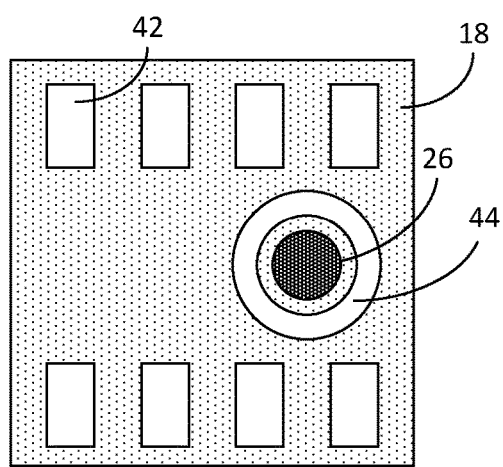
FIG. 3 is a bottom view of a rangefinder according to an aspect of the present disclosure.

FIG. 3 illustrates a bottom view of an embodiment of the rangefinder. Substrate 18 contains a plurality of electrical contact pads 42 that provide electrical connection to the MUT and ASIC. The acoustic port 26 is surrounded by a sealing ring 44 which may be attached to the end users circuit board using a solder reflow process. The signals carried on contact pads 42 may include power, ground, an interrupt pin and a digital serial interface, for example serial peripheral interface (SPI) or inter-integrated circuit (I2C). The following table illustrates an example of the signals carried on contact pads 42 in the case of an I2C serial interface:

TABLE 1

| Signal | Description |
| --- | --- |
| VDD | Power supply voltage. |
| GND | Ground |
| SCL | Serial-data clock for I2C interface |
| SDA | Serial data I/O terminal for I2C interface |
| INT | Interrupt pin |

Figure 4A:
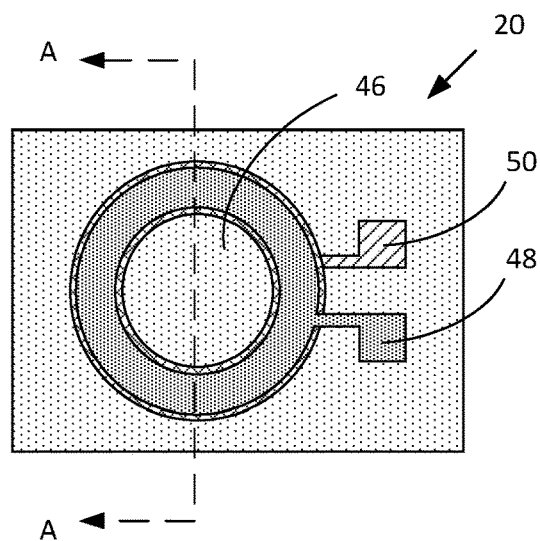
FIG. 4A is a top view of a micromachined ultrasonic transducer according to an aspect of the present disclosure.
Figure 4B:
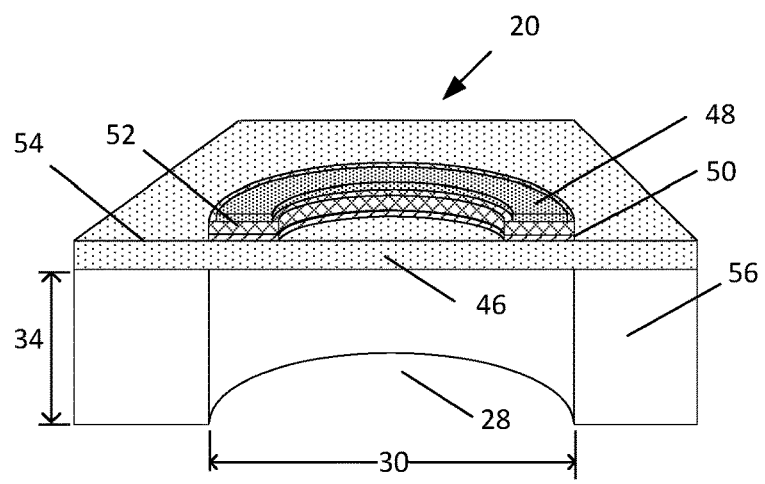
FIG. 4B is a cutaway cross-section perspective view of the micromachined ultrasonic transducer of FIG. 4A taken along line A-A of FIG. 4A.

FIG. 4A shows a top view of one embodiment of micromachined ultrasonic transducer (MUT) 20. FIG. 4B shows a cross-section view of one embodiment of MUT 20, corresponding to a cross-section cut through line AA in FIG. 4A.

Various types of MUTs have been demonstrated, among which are capacitive MUTs (CMUTs) and piezoelectric MUTs (PMUTs). Each type of MUT consists of a thin diaphragm or membrane 46. The CMUT and PMUT differ in the method used to provide electrical transduction of the membrane vibration: in a CMUT, capacitive transduction is used, whereas in a PMUT piezoelectric transduction is used. FIGS. 4A-4B show a PMUT with a ring of piezoelectric material 52 spanning the perimeter of membrane 46. A top electrode 48 and bottom electrode 50 provide electrical contacts to piezoelectric ring 52 which transduces vibration of membrane 46 into an electrical signal. When the MUT functions as a transmitter, an electrical signal applied between electrode 48 and electrode 50 produces vibration of membrane 46, launching an acoustic pressure wave. When the MUT functions as a receiver, an acoustic pressure wave incident on membrane 46 induces membrane vibration, producing a measurable electrical signal on electrodes 48 and 50.

In the implementation shown in FIGS. 4A-4B, membrane 46 is formed of a thin passive layer 54 deposited on the surface of a MUT substrate 56. Various materials such as silicon, silicon dioxide, silicon nitride, may be used to form passive layer 54. The MUT substrate 56 may be made of silicon or other materials such as glass. A pipe-like resonant cavity 28 is etched into the MUT substrate 56 to release membrane 46. When substrate 56 is silicon, cavity 28 may be etched using deep reactive ion etching (DRIE). The thickness of the MUT substrate 56 determines the length 34 of pipe 28, and the diameter 30 of cavity 28 is determined by the DRIE process. FIGS. 4A-B show a circular cavity 28 and membrane 46, however many other configurations including square, hexagonal, and rectangular are possible. The diameter of cavity 28 is shown to be the same as the diameter of membrane 46, however cavity 28 may be either smaller or larger than membrane 46.

According to aspects of the present disclosure an acoustic rangefinder apparatus of the type described herein may incorporate a charge-pump to convert the input supply voltage to a higher voltage used to transmit ultrasound. The rangefinder apparatus may also include a digital serial interface that allows the end user to program minimum and maximum range thresholds. When an object is detected within the range thresholds, the rangefinder sets one of the digital outputs to a high level, thereby indicating that an object has been detected within range. The end user may also read the range to an object through a digital serial interface.

Figure 5:
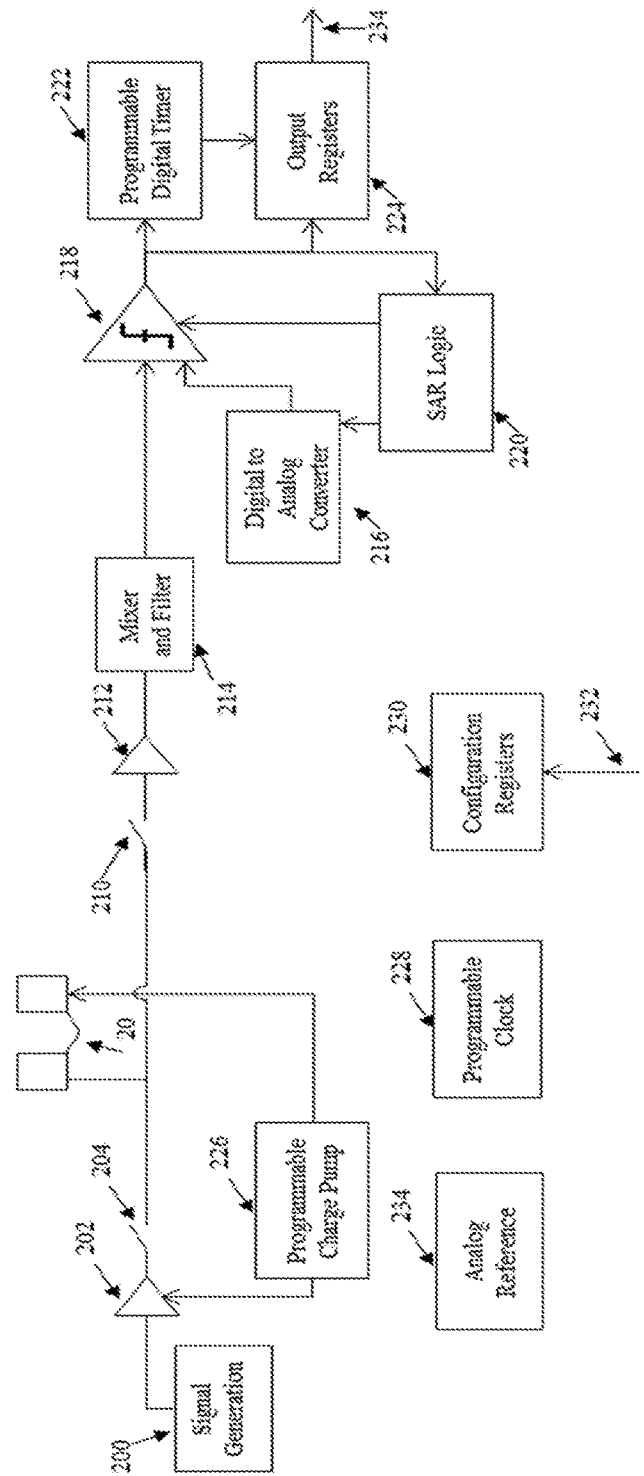
FIG. 5 is a block diagram of an embodiment of an electronic assembly containing a rangefinder according to an aspect of the present disclosure.

Further details are provided regarding the rangefinder electronic sub-assembly. In the embodiment of FIG. 5, all of the blocks except the MUT 20 are contained in an ASIC assembly 22 which controls the rangefinding measurement. It will be appreciated that the ASIC assembly 22 may comprise a single integrated circuit or several integrated circuits, and may include additional discrete components.

In the implementation depicted in FIG. 5, a measurement cycle begins with the generation of a transmit pulse by signal generation block 200. A programmable charge pump 226 boosts the input power supply voltage, which is in the range of 1V to 5V, to a transmit voltage level, which is in the range of 1.8V to 100V, and more specifically in the range 5V to 32V. Programmable charge pump 226 may also supply bias voltage to transducer 20. Amplifier 202 transmits a signal through closed transmit switch 204 to actuate micromachined ultrasound transducer 20, which emits a sound pulse. Amplifier 202 may be configured to operate in a non-linear fashion.

After a transmit duration in the range of 10 microseconds to 30 milliseconds, and more specifically in the range of 50 microseconds to 1 millisecond, transmit switch 204 is opened and receive switch 210 is closed. An echo signal received by transducer 20 is amplified by amplifier 212 and demodulated and filtered by mixer and filter block 214. In the illustrated implementation, a phase-insensitive demodulator is used. A designer skilled in the art will appreciate that a complex demodulator which demodulates the in-phase and quadrature components of the received echo signal may be used instead. The receive cycle lasts between 100 microseconds and 50 milliseconds, and more specifically in the range of 200 microseconds to 10 milliseconds.

Comparator 218 compares the demodulated echo signal with a threshold set by a digital to analog converter 216. The output of comparator 218 may be used in several modes. In a first mode, a programmable digital timer 222 uses a programmable clock 228 to accumulate the time since the start of the transmit pulse. The programmable digital timer 222 is configured to load its count value into output registers 224 when the comparator 218 transitions from low to high, signaling the reception of an echo. The programmable digital timer may be configured to only load its count value into output registers 224 when the count value is between a certain high and low threshold, signaling that an object is within a pre-programmed range. The programmable digital timer 222 may trigger an external interrupt for the purposes of waking up an external device.

In a second mode, the output of comparator 218 may be used by successive approximation register (SAR) logic 220 to reconfigure the digital to analog converter (DAC) 216 to provide a better approximation of the value of the echo signal. In this way a high resolution sample of the echo signal may be stored. The comparator 218 may be preceded by a sample and hold block (not shown) which may be used to sample the signal periodically and convert the analog signal to a corresponding digital value. The sampling rate for this analog-to-digital conversion process may be in a range of, e.g., 1 kHz to 100 kHz, and more specifically 4 kHz to 40 kHz. The SAR logic 220 reconfigures the DAC 216 between 4 to 16 times per sample, providing between 4 to 16 bits resolution, and more specifically, 8 to 12 bits. This digital representation of the echo signal is stored in a memory, e.g., output registers 224. During the measurement, output signal 234 may be used to signal a wakeup event, to output range data, or to output echo signal data.

A configuration signal 232 from an external electronic device configures configuration registers 230 which control the various blocks in the design, including but not limited to blocks 200, 226, 204, 210, 212, 214, 220, 216, and 222. A programmable clock 228 provides a stable reference clock to blocks including but not limited to signal generation block 200, programmable charge pump 226, transmit switch 204, receive switch 210, amplifier 212, mixer and filter block 214, DAC 216, SAR logic 220, comparator 218, programmable digital timer 222, and output registers 224. The clock 228 is used to time and transition between transmit, receive, and idle states of the rangefinder. An analog reference 234 provides analog reference signals to blocks including but not limited to programmable charge pump 226, amplifier 212, mixer and filter block 214, comparator 218, and DAC 216.

Figure 6:
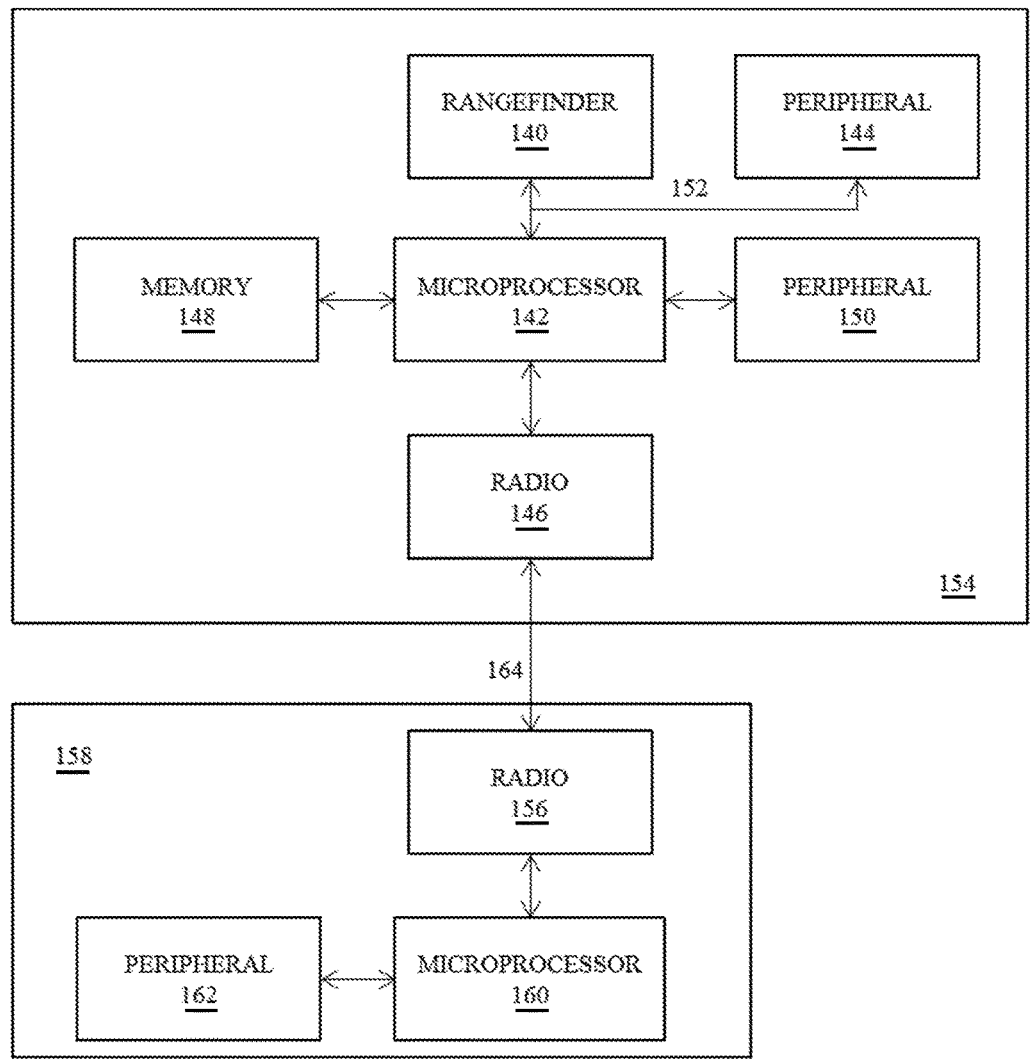
FIG. 6 is a block diagram of an embodiment of an ultrasonic rangefinder according to an aspect of the present disclosure.

In the implementation shown in FIG. 6, a rangefinder 140, which may be configured as described above with respect to FIG. 2 through FIG. 5, may be part of an electronic assembly 154 that contains a microprocessor 142, a radio transceiver 146, a memory 148 and several peripherals 144, 150. The rangefinder 140 may be connected through a shared bus 152, which is shared with additional peripheral(s) 144. By way of example, and not by way of limitation, the ASIC 22 may be coupled to the shared bus 152. The rangefinder 140 may be configured to perform a range measurement periodically with a period between e.g., 1 msec and 10 sec, or more specifically, a period between 10 msec and 1 sec. The other components on the electronic assembly 154 are configured to be in a low-power state. Because the rangefinder 140 can be operated in a low power consumption mode, it will be appreciated that rangefinder 140 can act as a wakeup switch for electronic assembly 154. When rangefinder 140 detects an object that enters or exits a predefined span of range, it can signal other components on the electronic assembly to wake and enter a higher power state.

In one implementation, the rangefinder 140 may be configured to detect objects within a certain range. On detection of an object, the rangefinder wakes microprocessor 142 which transmits a signal through a channel 164 using the radio transceiver 146. The signal is received by another radio transceiver 156 on an electronic assembly 158, causing microprocessor 160 to trigger peripheral 162 to perform a useful action. It will be appreciated by a designer skilled in the art that similar embodiments can be used to trigger different actions by different peripheral(s) 162. This may include replacing radio 146, channel 164, and transceiver 156 with a wired serial connection or an optical or infrared signaling device. It should be appreciated that in some cases transceiver 146 may be operated as a transmitter only and transceiver 156 may be operated as a receiver only.

Figure 7:
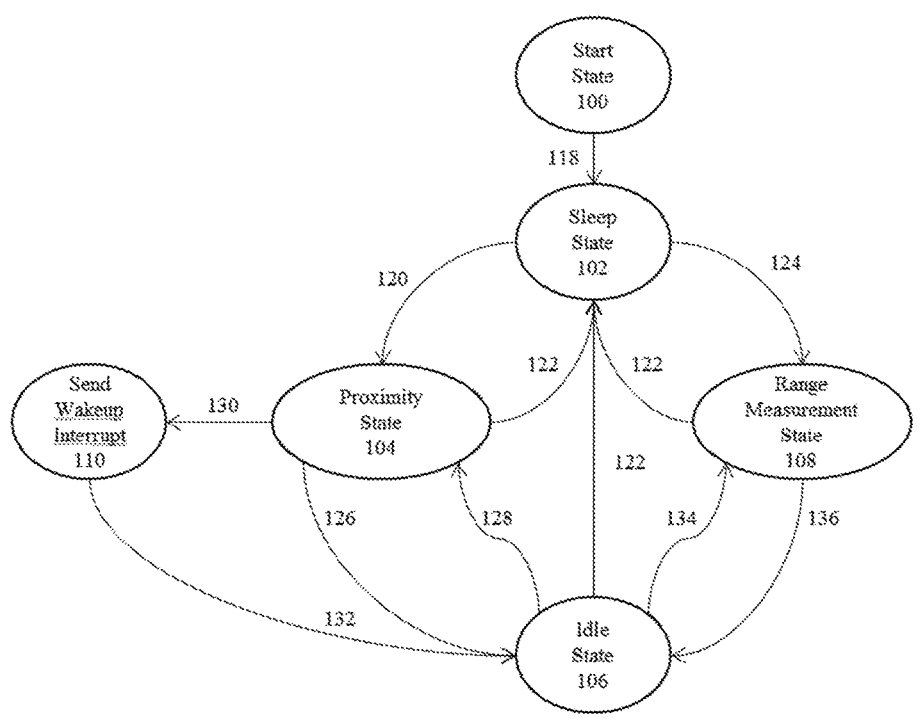
FIG. 7 is a state diagram illustrating a method for operating an ultrasonic rangefinder according to an aspect of the present disclosure.

Further details are now provided regarding the operation of the various states of the rangefinder. In the method of operation shown in FIG. 7, the rangefinder is in start state 100 at power up. After a transition period 118, the rangefinder enters a sleep state 102 wherein most of the electronic circuitry is powered down. For example, in FIG. 5, signal generation block 200, amplifier 202, programmable charge pump 226, transmit switch 204, receive switch 210, amplifier 212, mixer and filter block 214, DAC 216, comparator 218, programmable digital timer 222, output registers 224, SAR logic 220 and/or output signal 234 may be configured to be off or in a low-power state.

An external device or factory programming may cause the rangefinder to transition 120 into a proximity state 104 or to transition 124 into a range measurement state 108. A sleep signal 122 may cause the rangefinder to transition to the sleep state 102.

In the proximity state 104, a proximity measurement is performed. If a target is detected within predefined limits 130, a wakeup interrupt 110 is emitted. The rangefinder may also output the measured range. For example, in FIG. 6, the rangefinder 140 may wake the microprocessor 142, which may perform different actions based on the measured range, such as transmitting a signal using radio 146. After performing a measurement in the proximity state 104 for a programmable time period, the rangefinder enters an idle state 106. During idle state 106, several blocks may be powered down. After a programmable time period, a clock trigger 128 causes the rangefinder to re-enter the proximity state 104 and repeat the measurement.

During the idle state 106, an external input 134 causes the rangefinder to enter the range measurement state 108.

During the range measurement state 108, the rangefinder outputs the range to the target(s). It may also be configured to output a digitized version of the echo signal recorded by the rangefinder. Following the range measurement state 108, the rangefinder enters the idle state 106. After a programmable time period, clock trigger 134 causes the rangefinder to re-enter range measurement state 108 and repeat the measurement.

In one embodiment, multiple rangefinders may be used together to determine the position of an object in multiple dimensions. For example, two rangefinders placed in opposite corners of a device such as a tablet, laptop, or monitor, could be used to determine the z-axis range and x-axis position of an object. Similarly, three rangefinders could be used to triangulate the x, y, and z position of an object.

When multiple rangefinders are used together, it may be desirable to allow the rangefinders to work together in coordination, for example to avoid collisions between sound pulses that are transmitted at the same time. In such an application, the rangefinders may be configured to perform a "discovery" operation on power up, similar to that used in networking, wherein one rangefinder transmits a pulse of sound and waits for a predetermined interval to receive a responding pulse from a second rangefinder. Upon receipt of the first pulse of sound, the second rangefinder transmits a responding pulse. The responding pulse may be encoded to distinguish the response from echoes originating from the first pulse. This procedure may continue until all rangefinders have been enumerated, after which each rangefinder is configured to conduct range measurements in a time-division multiplexed (TDM) fashion, wherein the first rangefinder conducts a measurement in a predetermined time-slot, followed by the second rangefinder, and so on until all measurements have been completed. If during the "discovery" phase two rangefinders transmit at the same time, resulting in a collision, each rangefinder waits a randomly generated amount of time before re-transmitting a pulse, in a manner similar to the Ethernet protocol. Such a procedure may be implemented through appropriate programming, which may be implemented, e.g., by the Microprocessor 142 shown in FIG. 6.

Figure 8:
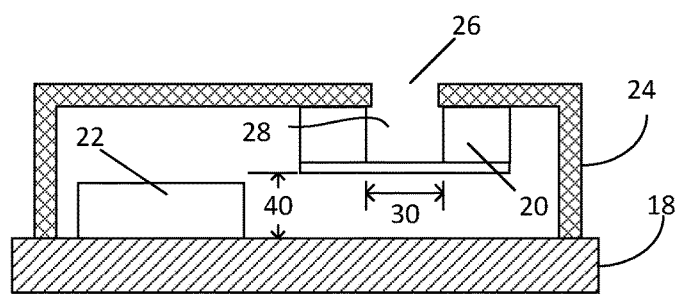
FIG. 8 is a cross section view of an alternative implementation of a rangefinder according to an aspect of the present disclosure.

In the embodiment illustrated in FIG. 2 and FIG. 3, the acoustic port 26 and electrical contacts 42 are located on the substrate 18. However, alternative embodiments are possible. In a second embodiment, shown in FIG. 8, the MUT 20 may be mounted on the lid 24 and the acoustic port 26 is in the lid 24. In this second embodiment, the ASIC 22 may remain on the substrate 18 or may be mounted on the lid 24 along with the MUT 20. If the MUT 20 is mounted on the lid 24 and the ASIC 22 is mounted on the substrate 18, electrical connections between the MUT 20 and the ASIC 22 may be formed using conductive traces on the lid 24 and substrate 18 in a fashion similar to that used to connect electrical components on printed circuit boards. In this embodiment, the MUT 20 is first electrically connected to the lid 24 and the ASIC 22 is electrically connected to the substrate 18 and a connection may be established between lid 24 and substrate 18 by means of a conductive via which may be created between the lid 24 and substrate 18. This process may use a third layer between the lid 24 and substrate 18 which contains the via (not shown).

Figure 9:
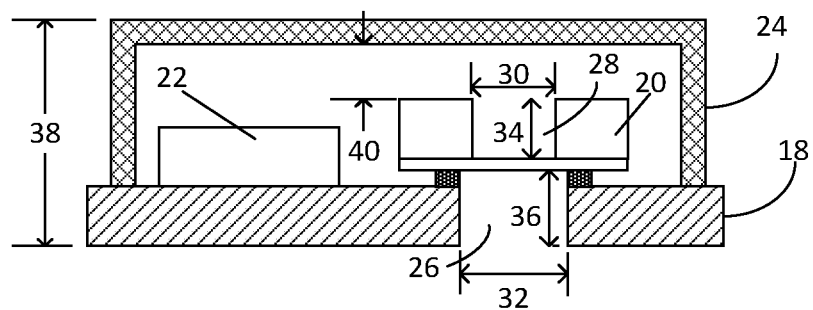
FIG. 9 is a cross section view of a yet another implementation of a rangefinder according to an aspect of the present disclosure.

In a third embodiment, shown in FIG. 9, the MUT 20 may be mounted such that port 28 faces the lid 24. In this case, the diameter 30 and length 34 of port 28 and the diameter 23 and length 36 of port 26 may be designed to enhance the acoustic output from port 26. In this case, the MUT 20 may be electrically connected to the substrate by eutectic bonding, solder bonding, or bump bonding.

All cited references are incorporated herein by reference in their entirety. In addition to any other claims, the applicant(s)/inventor(s) claim each and every embodiment of the invention described herein, as well as any aspect, component, or element of any embodiment described herein, and any combination of aspects, components or elements of any embodiment described herein.

The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC § 112(f). In particular, the use of "step of" in the claims herein is not intended to invoke the provisions of 35 USC § 112(f).

What is claimed is:

1. An acoustic rangefinder apparatus, comprising:
a substrate;
a lid mounted to the substrate;
a micromachined ultrasonic transducer (MUT) on the substrate or the lid, wherein the MUT includes an actuatable membrane;
an integrated circuit (IC) on the substrate operatively coupled to the MUT,
wherein the lid encloses the MUT and the IC,
wherein the lid or substrate includes an acoustic aperture;
wherein the lid or substrate includes a plurality of electrical interconnects to connect the IC to an external substrate;
wherein the IC is configured to drive the membrane to transmit an acoustic signal and detect a return signal, and wherein the IC is configured to determine a time of flight between emitting the acoustic signal and detecting the return signal.

2. The apparatus of claim 1, wherein the MUT is a capacitive micromachined ultrasonic transducer (CMUT).

3. The apparatus of claim 1, wherein the MUT is a piezoelectric micromachined ultrasonic transducer (PMUT).

4. The apparatus of claim 1, wherein the acoustic aperture is formed in the substrate.

5. The apparatus of claim 4, wherein the MUT is secured to the substrate to substantially cover the acoustic aperture.

6. The apparatus of claim 1, wherein the acoustic aperture is formed in the lid.

7. The apparatus of claim 6, wherein the MUT is secured to the lid to substantially cover the acoustic aperture.

8. The apparatus of claim 7, wherein the ASIC is secured to the substrate and electrical connections between the MUT and the ASIC are made through conductive traces on or within the lid and substrate.

9. The apparatus of claim 1, wherein the membrane is a piezoelectric unimorph formed of an active piezoelectric layer and a layer of passive material on a surface of a MUT substrate.

10. The apparatus of claim 1, wherein the MUT includes a ring of piezoelectric material spanning a perimeter of the membrane, wherein the ring of piezoelectric material is sandwiched between a first electrode and a second electrode, and wherein the second electrode is sandwiched between the membrane and the ring of piezoelectric material.

11. The apparatus of claim 1, wherein the membrane is between the acoustic aperture and the MUT substrate.

12. The apparatus of claim 1, wherein the MUT substrate is between the membrane and the acoustic aperture.

13. The apparatus of claim 1, wherein the apparatus is configured to transmit an initial pulse of sound and wait for a predetermined interval to receive a responding pulse from another acoustic rangefinder apparatus; and transmit a responding pulse upon receipt of a first pulse from another acoustic rangefinder apparatus.

14. The apparatus of claim 13, wherein the responding pulse is encoded to distinguish the responding pulse from echoes originating from the initial pulse.

15. The apparatus of claim 13, wherein the apparatus is configured to wait a randomly generated amount of time before re-transmitting an initial pulse.

16. The apparatus of claim 1, wherein the apparatus is configured to conduct range measurements in a time-division multiplexed (TDM) fashion in conjunction with one or more other range finder apparatus.

17. The apparatus of claim 1, wherein the integrated circuit includes a charge-pump to convert an input supply voltage to a higher voltage to drive the membrane.

18. The apparatus of claim 1, wherein the integrated circuit includes a digital serial interface that allows a user to program minimum and maximum range thresholds.

19. The apparatus of claim 18, wherein the digital serial interface is a serial peripheral interface (SPI).

20. The apparatus of claim 18, wherein the digital serial interface is an inter-integrated circuit (I2C) interface.

21. The apparatus of claim 1, further comprising a microprocessor coupled to the IC.

22. The apparatus of claim 1, further comprising a signal transceiver coupled to the microprocessor.

23. The apparatus of claim 1, further comprising an analog to digital converter which converts a received ultrasonic signal to a digital representation and stores it in a memory.

* * * * *